(12) United States Patent
Ulrich et al.

(10) Patent No.: US 7,914,903 B2
(45) Date of Patent: Mar. 29, 2011

(54) LAYERED COMPOSITE INCLUDING CUBIC BORON NITRIDE

(75) Inventors: Sven Ulrich, Stutensee-Blankenloch (DE); Jian Ye, Karlsruhe (DE); Konrad Sell, Karlsruhe (DE); Michael Stüber, Landau (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 231 days.

(21) Appl. No.: 11/705,336

(22) Filed: Feb. 12, 2007

(65) Prior Publication Data

US 2007/0141384 A1    Jun. 21, 2007

Related U.S. Application Data

(63) Continuation-in-part of application No. PCT/EP2005/008830, filed on Aug. 13, 2005.

(30) Foreign Application Priority Data

Sep. 2, 2004   (DE) .................. 10 2004 042 407

(51) Int. Cl.
   B32B 15/04   (2006.01)
   B32B 19/00   (2006.01)
   B32B 9/00    (2006.01)

(52) U.S. Cl. ........ 428/627; 428/698; 428/688; 428/689; 428/411.1; 428/547; 428/610; 428/212; 428/704; 51/307; 51/309

(58) Field of Classification Search .................. None
See application file for complete search history.

(56) References Cited

U.S. PATENT DOCUMENTS

| 4,683,043 A | | 7/1987 | Melton et al. | |
|---|---|---|---|---|
| 5,356,727 A | * | 10/1994 | Grenie et al. | 428/698 |
| 5,723,188 A | | 3/1998 | Lüthje et al. | |
| 5,976,716 A | * | 11/1999 | Inspektor | 428/698 |
| 6,004,671 A | * | 12/1999 | Yamamura et al. | 428/364 |
| 6,117,533 A | * | 9/2000 | Inspektor | 428/216 |
| 6,337,152 B1 | * | 1/2002 | Kukino et al. | 428/698 |
| 6,593,015 B1 | * | 7/2003 | Inspektor | 428/698 |
| 6,607,782 B1 | * | 8/2003 | Malshe et al. | 427/189 |
| 7,081,424 B2 | * | 7/2006 | Okamura et al. | 501/96.4 |
| 2004/0209125 A1 | * | 10/2004 | Yamamoto et al. | 428/698 |

FOREIGN PATENT DOCUMENTS

| DE | 44 07 07 274 | 3/1995 |
|---|---|---|
| JP | 62207869 | 9/1987 |

OTHER PUBLICATIONS

R. Freudenstein et al., "Improvement of the Adhesion of c-BN Films by Bias-Graded h-BN Interlayers", *Thin Solid Films* 420-421(2002) 132-138.

K. Yammamoto et al., "Depositon of Well Adhering cBN Films Up to 2 μm Thickness by B-C-N Gradient Layer System", *Thin Solid Films*, 377-378 (2000) 331-339.

* cited by examiner

*Primary Examiner* — Jennifer C McNeil
*Assistant Examiner* — Vera Katz
(74) *Attorney, Agent, or Firm* — Klaus J. Bach

(57) ABSTRACT

In a layered composite including a substrate comprising a number of individual layers disposed on the substrate, at least one of the individual layers includes cubic boron nitride formed by material deposition, the cubic boron nitride including oxygen added during deposition of the material.

7 Claims, 5 Drawing Sheets

LAYERED COMPOSITE INCLUDING CUBIC BORON NITRIDE

This is a Continuation-In-Part Application of International Patent Application PCT/EP2005/008830 filed Aug. 13, 2005 and claiming the priority of German application 10 2004 042 407.1 filed Sep. 2, 2004.

BACKGROUND OF THE INVENTION

The invention relates to a layered composite on a substrate comprising at least one individual layer deposited on the substrate and including cubic boron nitride.

Because of its excellent material properties, cubic boron nitride is a super-hard material—after the diamond the hardest material—particularly suitable for use in connection with cutting tools such as chisels, cutting- or drilling tools as well as shaping tools in order to improve their service life and for high operating speeds. Cubic boron nitride even has a large advantage over diamonds in that it is chemically resistant with respect to iron materials.

The synthesis of thin cubic boron nitride layers, that is layers of a thickness of between 50 nm and 300 nm, is possible only by PVD or PECVD methods because during the formation of the super-hard cubic phase the layer must be subjected to ion bombardment. The ion bombardment, however, is accompanied by the development of such high internal stresses that the layers, beginning with a certain thickness begin to fail typically between 50 and 300 nm, that is, they peel off the substrate. For this reason, such layers did not find any practical use in spite of the high potential thereof.

As examples for the deposition of thick cubic boron nitride layers reference is made to the following publications identified at the end of the description:

[1] discloses cubic boric acid layers which are deposited via a plasma torch. With this method, however, only small surface areas of several mm² can be coated. And even in this small coating area, the layer thickness distribution as well as the layer build up is, as a result of this method, extremely inhomogeneous. The layer thickness drops continuously down to zero and there are on the other hand coated areas in which the boron nitride is deposited almost exclusively in the non-cubic form. Furthermore, there is a limited reproducibility, which results in substantial variations in the growth rate. Concerning the coating of tools and machine components the required control of the plasma torch beam for complex tool and machine component geometries is extremely expensive and for this reason actually impossible to perform with high-quality resolution.

[2] discloses the generation of cubic boron nitride layers with a boron carbide target in an oxygen-free atmosphere. The layers which contain carbon but no oxygen however have a high internal tension level of up to 17 GPa.

[3] discloses the deposition of thick cubic boron nitride layers at high temperatures of typically 1200° C. Herein internal tensions in the layer are reduced bringing the silicon substrate to a plastic state. These measures for the reduction of the internal tensions and the high substrate temperatures however make the coating of tools impossible.

[4] discloses the manufacture of boron nitride layers without the addition of oxygen wherein the internal tensions are reduced by high-energy argon ion implantation at an energy level of 300,000 eV. By alternating cooling and ion implantation, which occurs in two different apparatus, cubic boron nitride layers with thicknesses of 1.3 μm could be produced. The area which is exposed is typically 1 cm², the substrate volume is limited to 1 cm³ and the travel distance of the ions is about 180 nm. For the deposition of a 1.3 μm thick layer with an area of 1 cm² seven cycles are needed including coating, ion-implantation and subsequent heat treatment and this treatment requires about half a month.

It is the object of the present invention to provide a layer composite wherein boron nitride of at least one individual layers is present in a cubic modification and the limitations and disadvantages mentioned above are overcome, particularly the concerning the coating of tools or machine components even in connection with layer thicknesses of more than 2 μm and relatively large lateral dimensions.

SUMMARY OF THE INVENTION

In a layered composite including a substrate comprising a number of layers disposed on the substrate, at least one of the individual layers includes cubic boron nitride formed by material deposition, the cubic boron nitride including oxygen added during deposition of the material.

For good dosing control, the oxygen may be added for example together with argon (Ar) or an Ar:$O_2$ gas mixture, wherein the Ar can be replaced by another process gas, for example, helium (He), neon (Ne), Krypton (Kr), Xenon (Xe), or Nitrogen ($N_2$). Furthermore, the oxygen may be transferred by an oxygen containing target via a PVD process to a gaseous phase and then precipitated.

The oxygen assumes the N-location of the cubic boron nitride lattice structure, settles in intermediate lattice locations or enriches itself in the grain boundaries between the crystallites. Basically, the oxygen influences the precipitation kinetics in a positive way so that surface and volume diffusion processes can be optimized and, as a result, internal tensions are reduced still during layer growth.

By the addition of the oxygen during the layer deposition of the cubic boron nitride layers as described above, the internal tensions in the deposited layers are advantageously reduced and the adhesion strength is increased to such an extent that layers with a thickness of at least 2 μm can be produced which are relevant for wear protection. The predetermined addition of oxygen occurs preferably during the whole coating procedure.

Oxygen-containing cubic boron nitride layers can be produced basically with all PVD processes and all plasma-supported CVD processes.

With the PVD and plasma-supported CVD processes, layer-forming particles impinge with a certain flux density and a certain energy as neutral particles or ionized particles on the substrate or, respectively, directly on the growing layer and are installed in the process into or onto the lattice structure of the layer surface. Preferably, but not necessarily, the substrate is used in the process as an electrode for the mentioned electrical field. The layer-forming particles may be;

Boron (B): neutral, simply or multiply ionized,
Nitrogen (N): neutral, simply or multiply ionized,
Oxygen (O): neutral, simply or multiply ionized,
molecules or clusters comprising boron, nitrogen- and oxygen atoms: neutral, simply or multiply ionized,
Helium (He), neon (Ne), argon (Ar), krypton (Kr) or Xenon (XE), that is, the elements of the group O of the periodic system/noble gases, plasma atmosphere), neutral, simply- or multiply ionized,
foreign atoms, ions, molecules or clusters which, in addition to Boron, nitrogen, oxygen, helium, neon, argon, krypton or xenon contain also other elemental components, neutral, simply or multiply ionized.

Furthermore, ions must impinge onto the substrate or, respectively, the growing layer with a certain energy $E_{ion}$ and a certain flux density (I) ion. Those ions may be:

- boron: simply or multiply ionized,
- nitrogen: simply or multiply ionized,
- oxygen: simply or multiply ionized,
- helium, neon, argon, krypton or xenon, simply or multiply ionized,
- foreign ions foreign molecule ions or foreign cluster ions, which, in addition to boron, nitrogen or noble gases, comprise also other elemental components, simply or multiply ionized.

In this connection, the current densities and the energies of the layer-forming particles and the ions must be so selected that, with regard to the elemental composition of the layer, the following conditions are fulfilled:

The ratio of boron and nitrogen [B]:[N] must be between 0.85 and 1.15:$0.85 \leq [B]:[N] \leq 1.15$.

The oxygen concentration [O] must be between 3 at % and 15 at %:$3$ at $\% \leq [O] \leq 15$ at %.

the sum of the concentrations of Helium [He], Neon [Ne], argon [Ar], Krypton [Kr] or Xenon [Xe] is equal or less than 7 at %; $[He]+[Ne]+[Ar]+[Kr]+[Xe] \leq 7$ at %.

The concentration of elemental parts other than boron, nitrogen, oxygen, helium, neon, argon, krypton or xenon may be up to 5 at % but must be kept lower if the particular particle prevents the formation of the cubic phase at a particular concentration and this concentration is below 5 at %.

Furthermore, all particles which impinge on the substrate or, respectively, the growing layer with a certain flow density and which are installed in the layer define the flux of the particles $\Phi_0$ forming the layer. On the basis of the energy of these particles, an average energy $E_0$ is defined. All ions which reach the surface of the substrate or of the growing layer with a certain flow density define the flux of the ions $\Phi_{ion}$. With the information concerning the energy of these particles, the average ion energy $E_{ion}$ is defined. The ratio $\Phi_{ion}/\Phi_0$ and the energies $E_0$ and $E_{ion}$ must be so selected that the cubic phase is formed.

It is within the scope of the present invention to use oxygen for the reduction of the internal tensions in composite materials (composite and nano-composites), multilayer- and nano-laminated multilayer structures as well as any kind of combination of these layer concepts which consist fully or partially of cubic boron nitride (C—BN). Furthermore, the first two layers are not a necessary pre-condition for depositing thick C—BN:O-layers.

For the coating of tools with cubic boron nitride, a tool operating speed and life particularly in the field of emitting iron-containing alloys is expected as it cannot be achieved with any conventional coatings.

The invention will be described below in greater detail with reference to the accompanying drawings.

DESCRIPTION OF PARTICULAR EMBODIMENTS OF THE INVENTION

Figure 1:
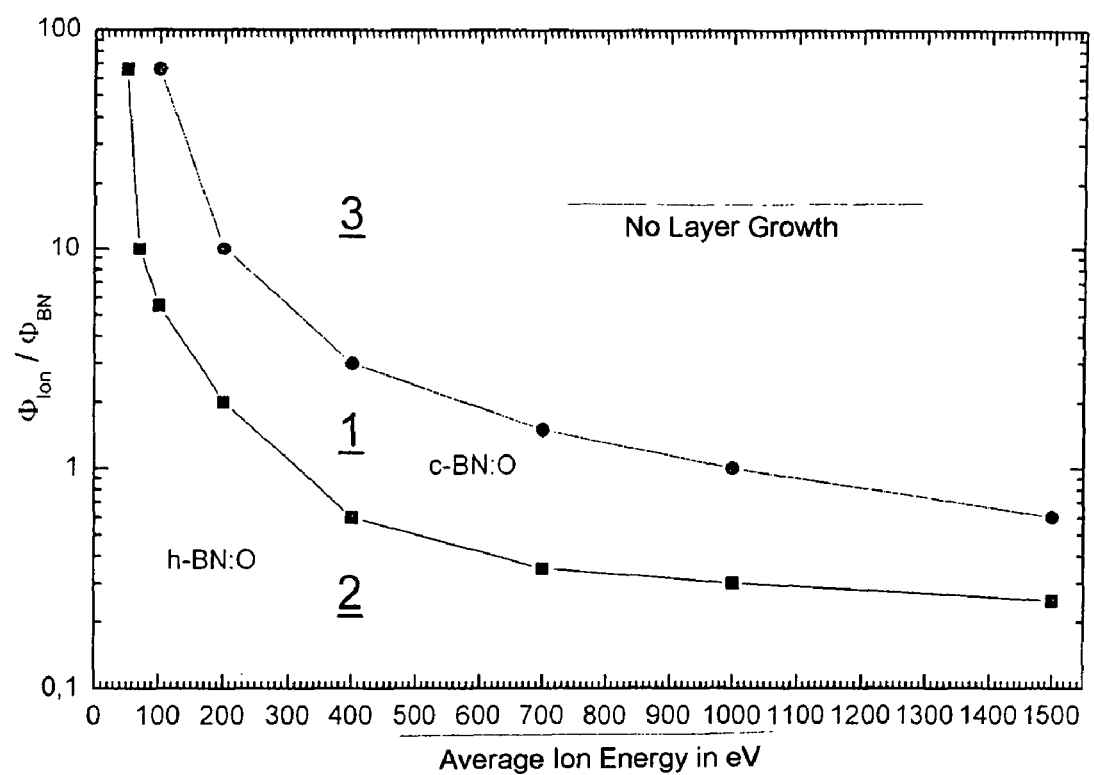
FIG. 1 shows an experimentally developed parameter field for the deposition of oxygen-containing cubic boron nitride layers.

With a CVD/PVD hybrid deposition apparatus oxygen containing cubic boron nitride layers were manufactured successfully, on planar-silicon substrates with layer thickness of 500 nm, 1.8 µm, and 2.5 µm. As coating sources magnetron atomization units, an ECR ion cannon and an ECR plasma source were available. A rotatable substrate carrier was used to which a DC or a high frequency substrate base voltage was applied and which was heated to 850°.

All layers were produced on a silicon substrate as a three-layer system consisting of a boron-rich ion energy graded adhesion layer (hexagonal boron nitride-oxygen-layer, h-BN: O-layer), a composition graded boron nitride-oxygen nucleation layer and a cubic boron nitride oxygen cover layer (C—BN:O-cover layer) in the order as mentioned.

The present case consequently concerns a layer system with three individual layer types in three individual layers. It is possible to provide, in the context of a multilayer system, at least two of the individual types of layers in periodic order as additional individual layers.

With the selected process execution, the adhesive strength was increased by the deposition of the first individual layer. By the deposition of the second individual layer, the nucleation of the cubic phase was controlled and by the deposition of the third individual layer, the actual growth of C—BN:O was optimized.

The experimentally determined individual layer thicknesses and the deposition times of the three-layer systems are represented below in table 1. The individual layers were provided only by changing the deposition times for the individual layers.

TABLE 1

Individual And Overall Layer Thicknesses And The Deposition Times Of The Oxygen-Containing Cubic Boron Nitride Layers

| Boron-rich ion energy graded adhesion providing layer | Composition graded BN:O nucleation layer | C—BN:O cover layer | Overall layer thickness |
|---|---|---|---|
| 100 nm | 100 nm | 300 nm | 500 nm |
| 12 min | 16 min | 81 min | |
| 215 nm | 180 nm | 1405 nm | 1800 nm |
| 25 min | 29 min | 380 min | |
| 300 nm | 250 nm | 2000 nm | 2550 nm |
| 35 min | 40 min | 9 hours | |

The manufacturing and process parameters for the individual layers as given in Table 1 are as follows, wherein the layer thicknesses were determined by raster-electronic cross-sectional imaging and with the aid of surface profile measurements.

Process Parameters for boron-rich Ion Energy Graded h-BN:O-layer.

To the stoichiometric hexagonal boron nitride target of a magnetron atomization unit, a 500 WHF target energy is applied and the target is atomized in an Ar—$N_2$—$O_2$ gas mixture. The substrate temperature is 350° C. and the amount of the negative substrate base voltage is 350 V. The gas mixture consists of 45 sccm Ar and 3 sccm of an Ar—$O_2$ gas mixture in a ratio of Ar to $O_2$ of 80% to 20%. The nitrogen gas flow is increased at equally spaced time intervals from 0 sccm by 0.5 sccm steps to 5 sccm and then in 1 sccm steps to 10 sccm. The operating gas pressure is initially about 0.25 Pa and at the end about 0.29 Pa.

Process Parameters for the C—BN:O Cover Layer:

To the stoichiometric, hexagonal boron nitride target of a magnetron atomization unit, a 500 W H.F. target energy is applied and the target is atomized in a Ar—$N_2$—$O_2$ mixture. The substrate temperature is 350° C. and the negative substrate base voltage is 350 V. The gas mixture consists of 45 sccm Ar, 3 sccm of an Ar—$O_2$-gas mixture with a mixture ratio of Ar to $O_2$ of 80% to 20% and 10 sccm $N_2$. The operating gas pressure is 0.29 Pa.

For the determination of the possible deposit parameters, basicall, the following procedure can be used. If with a selected combination of $\Phi_{ion}/\Phi_0$, $E_0$ and $E_{ion}$ the layer does not include a cubic phase, the ratio $\Phi_{ion}/\Phi_0$ and/or the energies $E_0$ and $E_{ion}$ must be increased until the cubic phase is formed but not to such an extent that with the atomization effects no layer grows on the surface (see FIG. 1).

FIG. 1 shows in a diagram the relationship between the ion flux $\Phi_{ion}$ and the particle flux $\Phi_{EN}$ (corresponding to the earlier mentioned general flux of particles $\Phi_0$ forming the layer) depending on the average ion energy $E_{ion}$ as determined experimentally in connection with the exemplary embodiment. The diagram shows three parameter ranges 1 to 3. A cubic boron-nitride-oxygen-layer (C—BN:O) is deposited in the range 1, in which a certain flux ratio $\Phi_{ion}/\Phi_{BN}$ or the average ion energy $E_{ion}$ reach a certain level. If this level is not reached (range 2) either the energy and/or the flux ratio are insufficient for a conversion toward the cubic BN:O during the deposition. As a result, the hexagonal modification is deposited (h-BN:O). In the range 3, on the other hand, either the energy and/or the ratio $\Phi_{ion}/\Phi_{BM}$ is too large, that is the layer-forming particles are again atomized so that no BN:O layer is formed.

The substrate temperature $T_s$ must fulfill the following conditions during the coating procedure:

during the nucleation process the temperatures must be at least 120° C.: $T_s \geq 120°$ C.
it must be less than 90% of the melting temperature of the substrate: $T_s \leq T_{M,S}$
it must be less than 90% of the melting temperature of the oxygen containing cubic boron nitride layer $T_{M-C—BN:O}$: $T_s \leq T_{M-C—BN:O}$.

Figure 2:
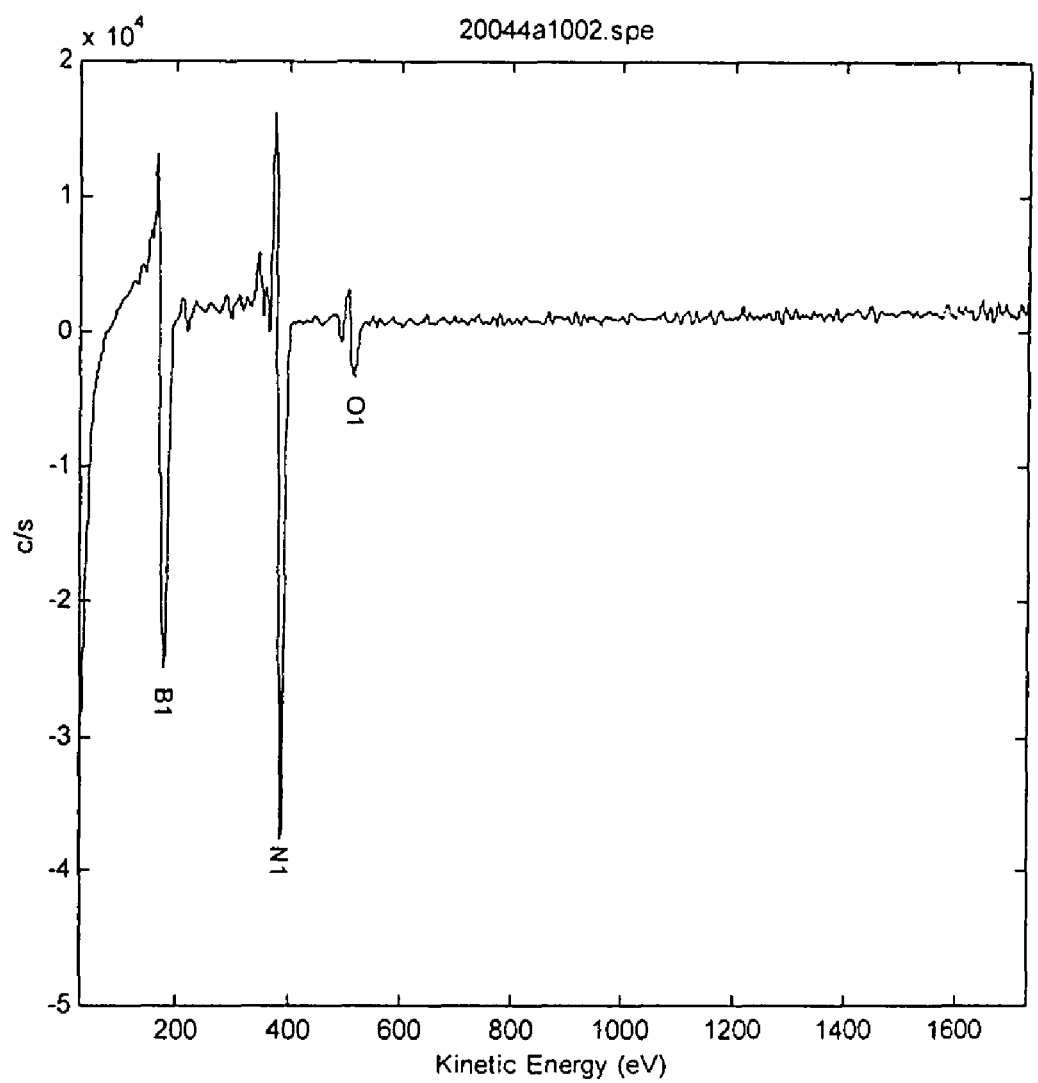
FIGS. 2a and 2b show AES overview spectra of a 500 nm thick oxygen-containing cubic boron nitride layer.
Figure 2:
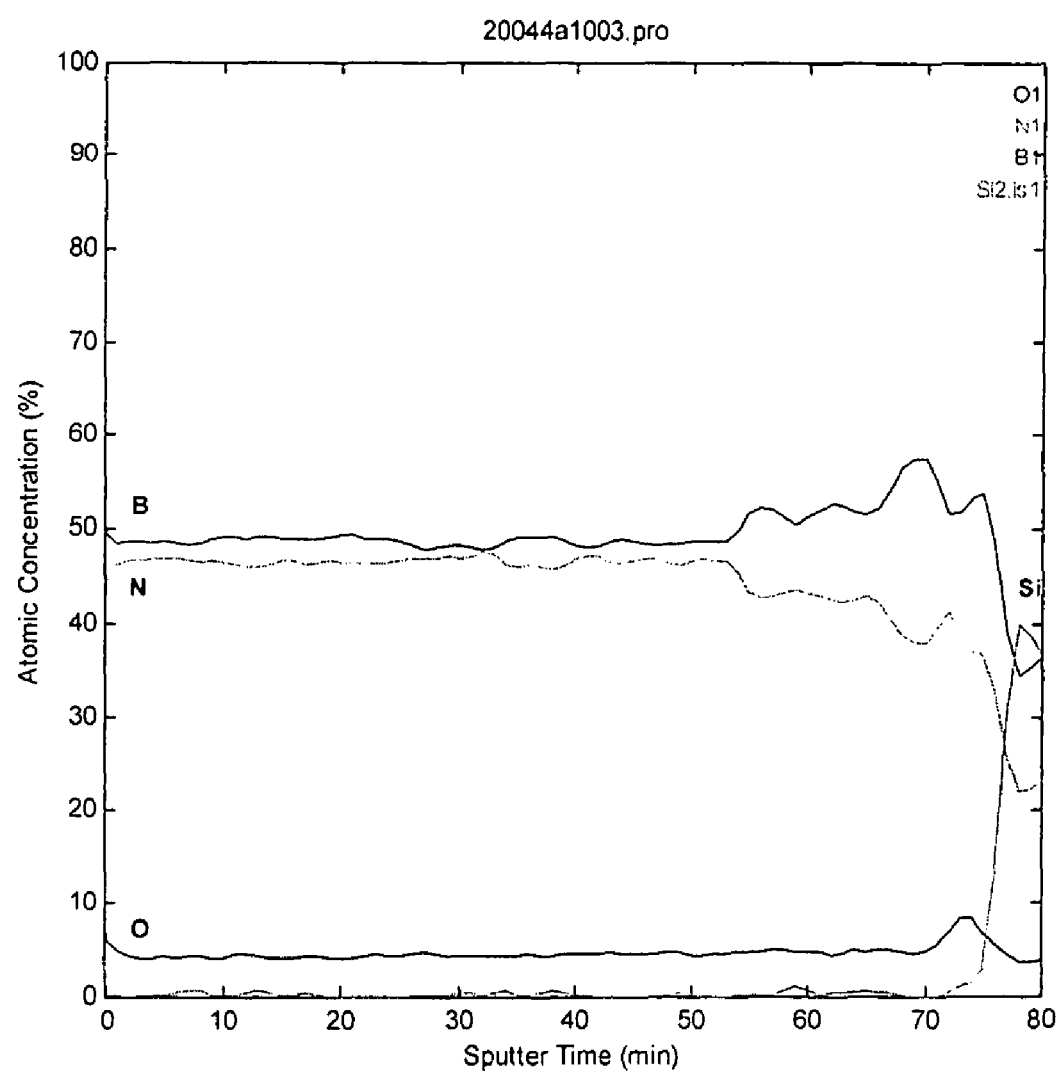

The composition of the individual layers mentioned above was determined with the aid of AES (Auger Electron Spectroscopy). FIG. 2a shows as an example an overview spectrum (c/s=signals per second over the kinetic energy in eV) of the 300 nm thick oxygen-containing cubic boron nitride layer of the layer composite indicated in FIG. 1 with a 500 nm overall thickness after ablation of 20 nm for surface cleaning. In the spectrum, three signals can be recognized, which represent the elements boron, nitrogen and oxygen. From this, the elemental concentration for boron at 48.6 at %, for nitrogen at 46.6 at % and for oxygen at 4.9 at % are determined. The sum of the compounds boron, nitrogen and oxygen add up to 100.1% (by rounding off), that is, there are no other compounds present and there is no room for doping by other compounds.

FIG. 2b shows as an example an AES depth concentration profile of a layer composite shown in FIG. 1 with an overall thickness of 500 nm. Herefrom, the homogeneous distribution of the element concentrations in the 300 nm thick oxygen-containing cubic boron nitride layer as well as the element distribution in the adhesion layer and the nucleation layer can be determined.

With increasing layer thickness also the electric charge increases in this analysis procedure. As a result, the measuring and an accurate evaluation of the AES spectra become more difficult even if the charge of the analysis surface is at least partially compensated for by the ion bombardment in combination with the offering of electrons. For that reason in the layer composite with an overall thickness of 2.55 μm the BN:O layer had to be locally atomized by the ion beams down to the silicon substrate whereby a crater with a cross-section similar to a Gauss distribution (crater profile) is formed. By a scanning of this crater profile which can be mathematically defined an accurate depth profiling could be established by which charges by a surface current over the crater profile toward the silicon could be noticeably easier reduced.

Figure 3:
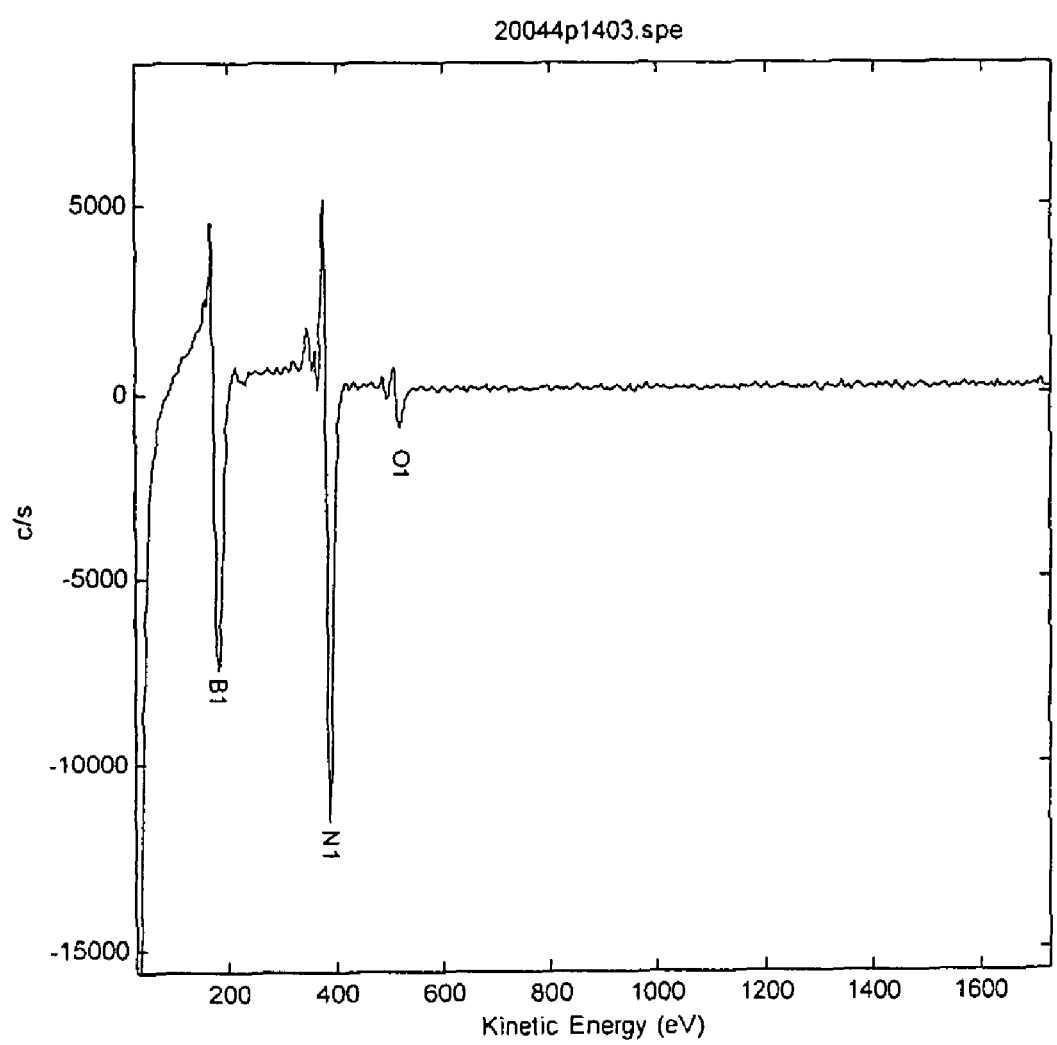
FIG. 3 shows an AES overview spectrum of a 2550 nm thick oxygen-containing boron nitride layer.

FIG. 3 shows the 2.55 μm thick BN:O-layer of table 1 of the earlier mentioned overview spectrum at the crater profile, that is, the elemental composition of the 2 μm thick oxygen containing cubic boron nitride cover layer. Herein, the boron concentration is 49 at %, the nitrogen concentration is 46.3% and the oxygen concentration is 4.6 at %. This is within the measuring accuracy in very good agreement with the elemental composition of the oxygen-containing cubic boron nitride cover layer of the 500 nm thick BN:O-layer and corresponds to the expectations on the basis of the process performance during the depositions of the cover layers.

Figure 4:
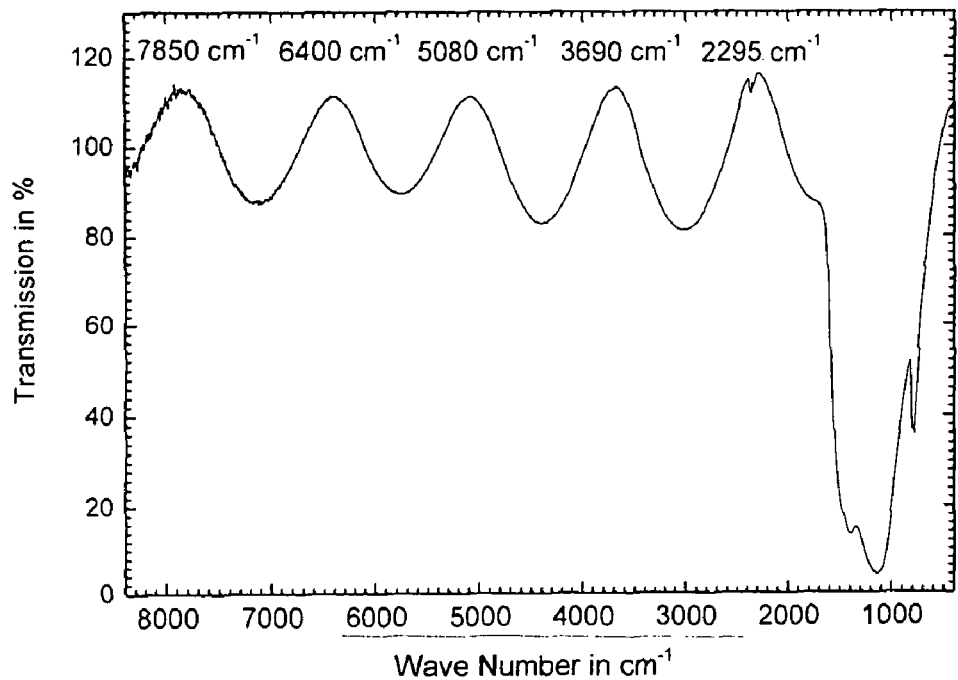
FIG. 4 shows a FTIR-spectrum of a 1800 nm thick oxygen-containing cubic boron nitride layer.
Figure 5:
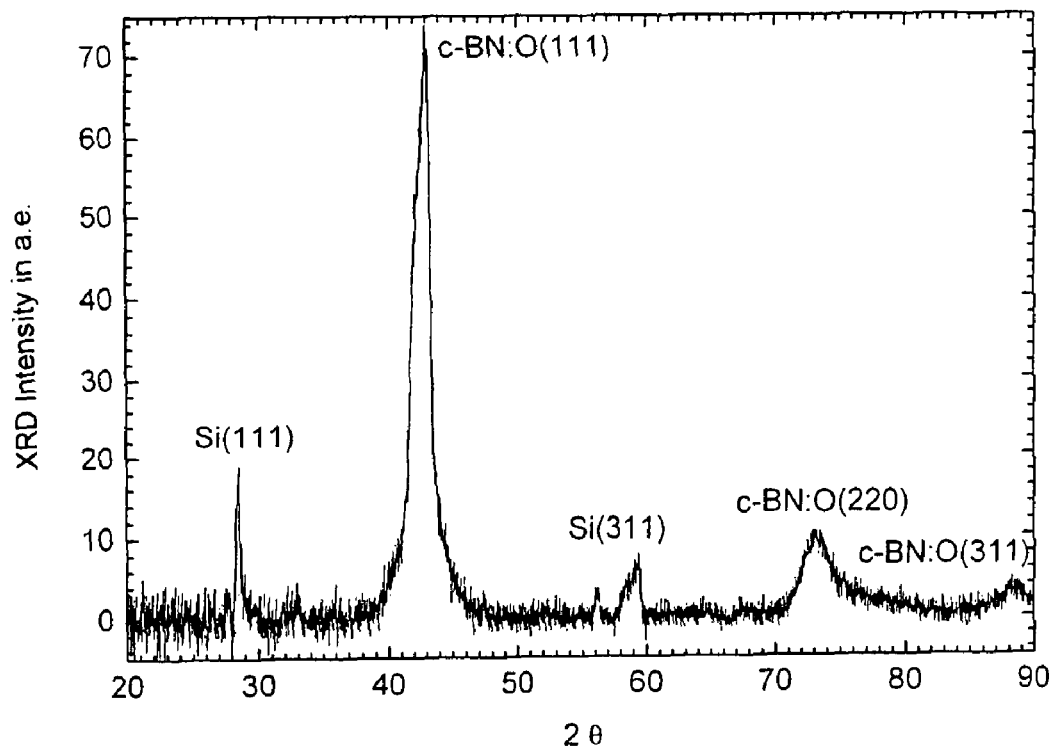
FIG. 5 shows an x-ray diffraction graph of a 1800 nm thick oxygen-containing cubic boron nitride layer.

The $sp^3$ hybridized bonding states are determined by infrared spectroscopy (FT1R, FIG. 4) and the cubic crystal structures are determined by x-ray diffraction (XRD, FIG. 5). FIG. 4 shows a transmission infrared spectrum in the wave number range of 400 $cm^{-1}$ to 8400 $cm^{-1}$. The well defined residual radiation bands of the 1405 nm thick c-BN:O cover layer at 1080 $cm^{-1}$ are easily recognizable. Furthermore, the B—NB bonding oscillation at about 780 $cm^{-1}$ and the B—N— stretch oscillation at 1380 $cm^{-1}$ are visible, which are mainly caused by the adhesion layer and the nucleation layer.

The oscillations are generated by the layer thickness interferences. The five maxima at 7850 $cm^{-1}$, 6400 $cm^{-1}$, 5080 $cm^{-1}$, 3690 $cm^{-1}$ and 2295 $cm^{-1}$ and the four minima disposed therebetween are clearly visible. Herefrom the layer thickness of the overall system of 1.8 μm can be estimated by:

$$d_{total} = \frac{\text{Number or periods}}{2 \cdot \text{average diffraction index} \cdot \text{wave number range}} = \frac{4}{2 \cdot 2 \cdot (7850 \, cm^{-1} - 2295 \, cm^{-1})}$$

The x-ray diffractogram which was taken at a tangential incident shows three signals, which can be assigned to the C—BN:O. They correspond to the signals of (111) C—BN at 43.3°, (220) C—BN at 74.1° and (311) C—BN at 89.8°. Consequently, the presence of the cubic oxygen containing boron nitride phase has been proved by means of FTIR on XRD.

Using a nano-indenter of the firm Hysitron, the hardness was measured on an about 2 μm thick, oxygen containing cubic boron nitride layer. The layer hardness at a maximum load of 2 mN was found to be 60.5 GPA±1.6 GPa, which corresponds to the theoretically expected value.

LITERATURE

[1] S. Matsumoto, W. Zhang: Jpn. J. Appl. Phys. 39 (2000) L442
[2] K. Yamamoto, M. Keunecke, K. Bewilogua: Thin Solid Films, 377/378 (2000) 331

[3] D. Litvinov, C. A. Taylor, R. Clarke: Diamond Relat. Mater. 7 (1998) 360

[4] H.-G. Boyen, P. Widmayer, D. Schwertberger, N. Deyneka, P. Ziemann: Appl- Phys. Lett. 76, (2000) 709

What is claimed is:

1. A layered composite including a substrate having disposed thereon, at least one individual layer including cubic boron nitride and being formed by material deposition, said cubic boron nitride having a cubic grating and including one of the groups comprising 48.6 at % boron, 4.6 at % nitrogen and 4.9 at % oxygen, and 49 at % boron, 46.3 at % nitrogen and 4.6 at % oxygen, the oxygen being added during deposition of the material and occupying nitrogen locations of the cubic boron-nitride grating or intermediate grating locations.

2. A layered composite according to claim 1, wherein the material deposition occurs by one of a PVD- and a plasma-based CVD method.

3. A layered composite according to claim 1, wherein the layered composite includes a boron-rich ion energy graded adhesion layer, a composition graded boron nitride-oxygen nucleation layer and a cubic boron-nitride-oxygen cover layer disposed on the substrate in the given order.

4. A layered composite according to claim 1, wherein a periodic layer arrangement comprises at least two different layers and at least one of the layers includes oxygen containing cubic boron nitride.

5. A layered composite according to claim 1, wherein at least one individual layer is a nano-composite including at least one component with cubic boron nitride.

6. A layered composite according to claim 1, wherein the layered composite comprises a hexagonal boron-nitride oxygen layer an adhesion providing layer, a composition-graded boron nitride-oxygen nucleation layer and a cubic boron nitride-oxygen cover layer on a substrate in the listed order.

7. A layered composite according to claim 1, wherein at least one individual layer is formed by a composite material wherein one component includes an oxygen-containing cubic boron nitride.

* * * * *